United States Patent [19]

Germer et al.

[11] Patent Number: 4,970,459
[45] Date of Patent: Nov. 13, 1990

[54] ELECTRONIC METER CHOPPER STABILIZATION

[75] Inventors: Warren R. Germer, Dover, N.H.; Maurice J. Ouellette, North Berwick, Me.

[73] Assignee: General Electric Company, Somersworth, N.H.

[21] Appl. No.: 279,161

[22] Filed: Dec. 2, 1988

[51] Int. Cl.$^5$ ............................................. G01R 19/00
[52] U.S. Cl. ...................................... 324/142; 324/127
[58] Field of Search ....................... 324/142, 130, 127; 330/9; 323/357

[56] References Cited

U.S. PATENT DOCUMENTS

| 4,182,982 | 1/1980 | Wolf et al. | 324/127 |
| 4,504,897 | 3/1985 | Blackwood | 323/224 |
| 4,616,174 | 10/1986 | Jorgensen | 324/127 |
| 4,713,608 | 12/1987 | Catiller et al. | 324/142 |

Primary Examiner—Reinhard J. Eisenzopf
Assistant Examiner—Edward Urban
Attorney, Agent, or Firm—R. E. Brunson; I. M. Freedman

[57] ABSTRACT

An improved DC stabilization system is provided in an electronic digital power meter of the type utilizing current transformers to scale and isolate the power line current and an analog to digital converter to convert the meter currents to a digital signal for signal processing. An unmodulated square wave signal is provided to trigger a chopper switch which connects the current transformer to an amplifier and provides a current signal output. A feedback current from the amplifier is provided through the feedback and sense windings of the current transformer by the chopper to compensate for the effects of DC offset voltage at the input of the amplifier. The square wave is a low frequency such that its harmonics and those of the power lines are different to minimize the gain bandwidth requirements of amplifiers in the system. The timing signals for the analog to digital converter are controlled to avoid sampling at the transition of the square wave signal to enhance conversion accuracy and means are provided to remove the signal inversion in the current signal introduced by the chopper.

21 Claims, 2 Drawing Sheets

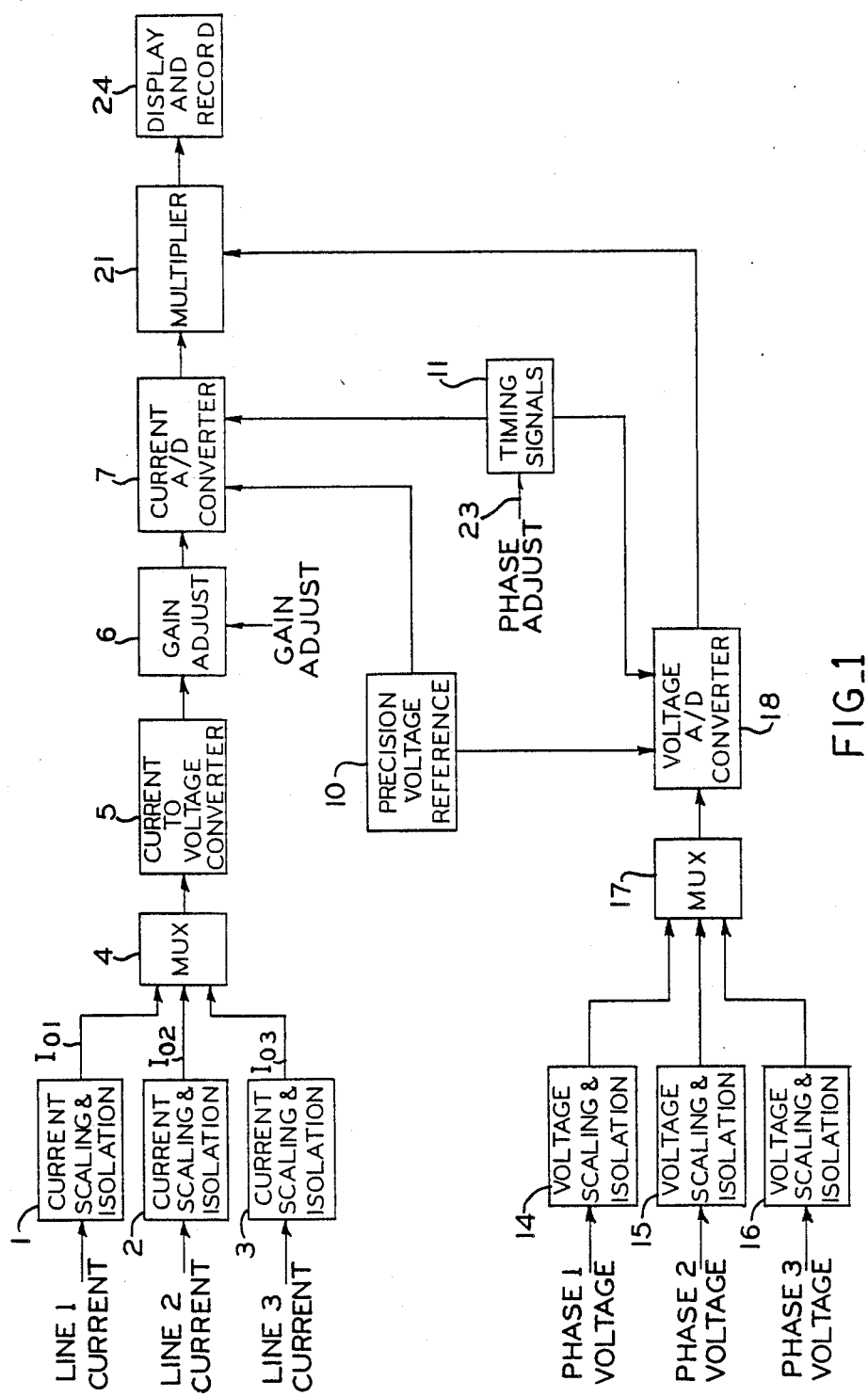
FIG_1

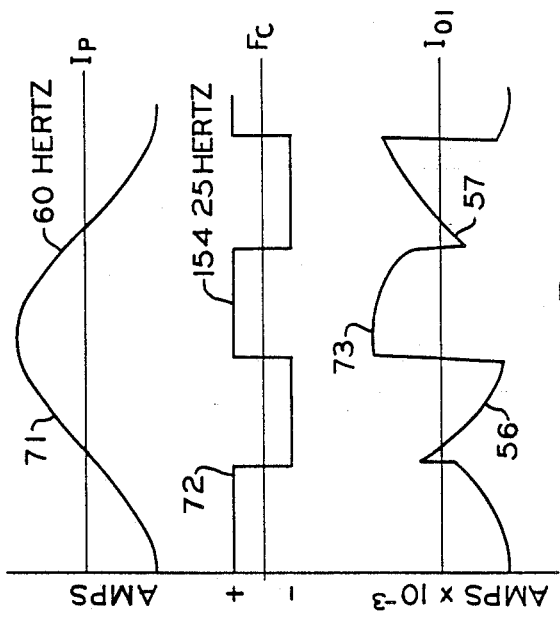
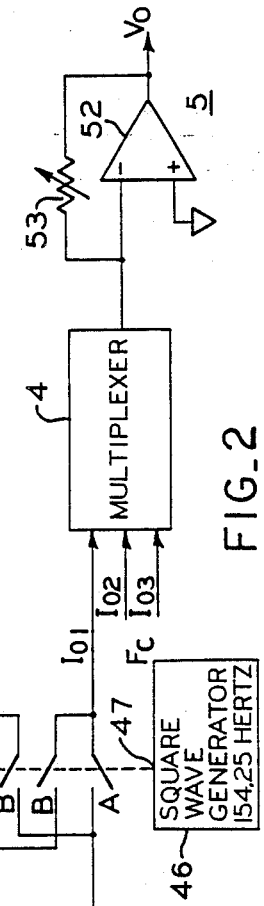
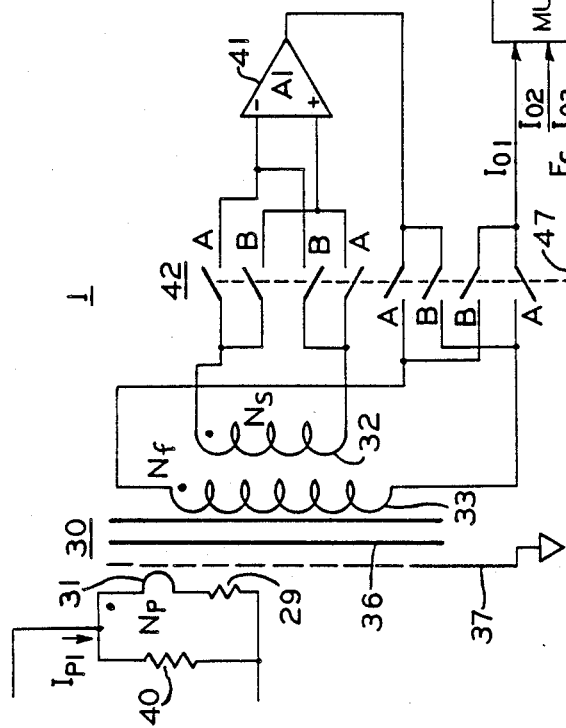
FIG_3
FIG_2

ELECTRONIC METER CHOPPER STABILIZATION

BACKGROUND OF THE INVENTION

The present invention relates to electronic power meters for measuring alternating current electric power and more particularly to a novel technique to provide direct current (DC) stabilization in power meters utilizing current transformers and operational amplifiers to sense current flowing in the power lines.

In the development of electronic power meters, such as watthour meters, it is conventional to utilize a current transformer in the power line to isolate the meter circuitry from the power line and to scale the current down to a value which is compatible with the electronic circuitry. The scaling factor in some power meters may be as high as 100,000 to one. Current transformers conventionally have only one or two turns in the primary circuit carrying the load current and many turns in the secondary winding whereby the current induced in the secondary winding while approximately proportional to the current flow in the primary, or in the power lines, is reduced by the ratio of the number of secondary turns divided by the number of primary turns.

However, the large power line currents flowing in the primary winding of the current transformers tend to saturate the core upon which the winding are wound. The use of larger cores or more effective core materials to prevent core saturation is undesirable because of the size and/or cost involved. It is known to utilize feedback windings on the current transformer and a feedback amplifier to induce an inverse alternating current (AC) sufficient to maintain the core magnetic flux near zero, thus keeping the core out of saturation. Since the current signals are fed through an operational amplifier, a DC offset is inherent in the amplifier characteristics and this offset may vary with factors such as time and temperature such that it cannot simply be adjusted out by variable circuit elements. Small DC effects such as amplifier offset are intolerable since they can cause the operational amplifier circuit, which may have a gain in the order of a million, to saturate which could greatly affect the accuracy of the power meter.

The use of a switching arrangement has been proposed to chop the current signal paths and provide DC stabilization of the amplifier while at the same time performing an analog multiplication function. Such an approach is shown in U.S. Pat. No. 4,761,605—Jochum, which issued on Aug. 2, 1988, and is assigned to the same assignee as the present invention. This approach requires a relatively high frequency modulated chopping signal and as a result requires a relatively wide bandwidth, high gain amplifier. Also, in an arrangement such as that shown by 4,761,605—Jochum, the relatively high frequency chopping signal necessitates better and more costly switches. In addition, since the chopping signal is modulated, it is more difficult to generate. It is desirable to provide a power meter wherein the chopping frequency can be a low frequency, to use less complex circuitry including less sophisticated operational amplifiers, and to eliminate the need for modulation and the associated pulse width modulator.

OBJECTS AND SUMMARY OF THE INVENTION

In view of the foregoing, in accordance with the present invention an electronic digital power meter is provided utilizing current transformers or current sensors to scale and isolate the power line current, and an analog to digital converter to convert the scaled current signal to digital form, and a novel stabilization system including a low frequency, unmodulated square wave signal to control the switching means, or chopper, which connects the current transformer to an amplifier to null the offset voltage through feedback and sense windings on the current transformer. The frequency of the square wave signal is selected to be low and of a frequency such that the harmonics of both the square wave signal and the power line frequency are different, thus avoiding introduction of meter inaccuracies. In addition, gain bandwidth requirements of amplifiers in the system are reduced. The analog to digital converter timing signals can be timed to avoid transitions of the square wave chopper signals, and signal inversions of the scaled current signal may be removed by logic circuitry in, or following, the analog to digital converter.

Accordingly, It is an object of the present invention to provide improved DC chopper stabilization in an electronic power meter.

It is a further object of the present invention to provide improved DC chopper stabilization in an electronic power meter which simplifies components and signal processing of the power signals.

It is another object of the present invention to provide improved DC chopper stabilization in a digital electronic power meter which does not require wide bandwidth, high gain amplifiers.

It is yet another object of the present invention to provide improved DC chopper stabilization in a digital electronic power meter in which the chopping signal is unmodulated and simple to generate.

BRIEF DESCRIPTION OF THE DRAWING

FIG. 1 is a block diagram of an electronic digital power meter embodying the present invention;

FIG. 2 is a schematic diagram of the chopper stabilization circuitry in accordance with the invention; and FIG. 3 is a plot of various signals present in the circuit of FIG. 2.

DESCRIPTION OF THE PREFERRED EMBODIMENT

Referring to FIG. 1 an electronic digital power meter is shown for three phase power lines. The current scaling and isolation circuits 1, 2 and 3 isolate the electronic circuitry from the three phase conductors of the power lines and provide scaled down current signals having magnitudes suitable for processing by the electronic circuitry. The details and operation of the scaling and isolation circuits, 1, 2 and 3 will be discussed in detail below regarding FIGS. 2 and 3. The scaled currents from circuits 1, 2 and 3 are fed to a current multiplexer 4 where they are combined into a time shared multiplex signal and then converted to a voltage signal in a current to voltage converter circuit 5. The amplitude of the voltage signal output from the current to voltage converter 5 is adjusted by the variable gain amplifier or gain adjust 6 before being fed to the current A/D converter 7 which converts the analog signal to a digital signal for further signal processing such as in a digital signal processor. A precision zener diode voltage reference source 10 provides a reference voltage and the timing signals circuit 11 provides timing signals to the current analog to digital converter 7 such that the reference voltage defines the amplitude of the converted or digital signal and the timing signals control the sampling of the analog signal.

The voltage applied to each of the three phase conductors of the power lines being metered are provided through transformed based voltage scaling and isolation circuits 14, 15 and 16 to a voltage multiplexer 17 which provides the multiplexed voltage signal to the voltage analog to digital converter 18. The voltage analog to digital converter 18 also receives a reference voltage from the voltage reference source 10 and timing signals from the timing signals circuit 11 to convert the analog voltage input signal to a digital signal for further digital processing.

The gain adjust 6 adjusts the gain of the digital current signal for calibration purposes. The adjusted digital current signal and the digital voltage signal are provided to multiplier 21 where they are readily multiplied to provide a signal which varies in accordance with the power being consumed on the power lines being metered.

A phase adjust control 23 adjusts the relative phase of the timing signals provided to the analog to digital converters 7 and 18 for accurate multiplication and response to true power in the power lines. The phase adjustment and phase compensation are disclosed in detail in our copending patent application, Ser. No. 279,178, filed concurrently with that for the present invention, entitled "Electronic Meter Digital Phase Compensation" and assigned to the same assignee as the present invention.

The power signal provided by the multiplier 21 is converted to kilowatt hours and displayed and/or recorded by the display and recorder 24.

The specific configuration of the current scaling and isolation circuits 1, 2 and 3 of FIG. 1 in accordance with the present invention are shown in FIG. 2. Referring to FIG. 2, the current transformer shown generally as 30 includes a primary winding 31 of but a single or a few turns through which a portion of the line current Ip to be measured flows. Resistors 29 and 40 are low temperature coefficient and split the current Ip such that a portion of Ip passes through the transformer primary winding 31. Current transformer 30 also includes a secondary sense winding 32 and a secondary feedback winding 33. The primary winding 31, sense winding 32 and feedback winding 33 are wound on torroidal core 36 which includes a grounded shield 37. Current flow in the feedback winding 33 is reduced approximately proportional to the inverse ratio of the number of turns of the primary winding 31 to that of feedback winding 33. To further reduce the current through the current transformer 30, it is common to provide shunt resistors 29 and 40 constructed of material having a low temperature coefficient serving to split the current Ip to scale down large current loads connected to the primary 31. The large turns ratio in the secondary windings 32 and 33 and the shunt resistors 29 and 40 provide a scaled down current flow in the feedback winding 33 which is used as an indication of the primary current Ip or Ip1. The scaling of meter line currents may be a ratio of 100,000-to-one for self-contained meters. The details of construction and operation of current sensors and transformers are set forth in some detail in copending U.S. patent application Ser. No. 259,234, filed Oct. 18, 1988, and assigned to the same assignee as the present invention.

The secondary sense winding 32 and feedback winding 33 are connected to a high gain amplifier 41 through a bank of switches or chopper 42. The square wave generator 46 provides the Fc chopping frequency or signal 47 of 154.25 Hertz. The frequency, once selected, is maintained stable and constant through use of a crystal oscillator. The 154.25 Hertz chopping signal is an unmodulated square wave of fifty per cent duty cycle, and any harmonics which may be generated are of a substantially different frequency than the power line 60 Hertz frequency and a wide range of its harmonics over the frequency range of interest in a power meter. The harmonics of the chopper frequency and of the power line frequency are not close to being equal through the 17th harmonic. A suitable chopping signal frequency for 50 Hertz power lines is 128.54 Hertz. The signal processing circuits of the power meter of FIG. 1 can readily filter out any harmonics of Fc.

The switches of chopper 42 may be suitable field effect transistor (FET) or CMOS semiconductor devices. The switches are arranged such that when switches A are closed or "on", switches B are open or in the "off" position; and when switches B are closed or "on", switches A are open or in the "off" position. The operation of a chopper such as 42 and one form of DC stabilization is described in U.S. Pat. No. 4,761,605, assigned to the same assignee as the present invention. The inherent DC offset of the amplifier 41 could cause the high gain amplifier to saturate and prevent accurate power measurements unless compensation for it is provided. In the present invention the DC offset voltage appears as an amplified signal in the DC output of amplifier 41. This signal is chopped by chopper 42 to an AC signal applied through the feedback winding 33 which appears as a ramping current of alternating positive and negative slope because of the inductance in the circuit. This results in a square wave voltage signal at the chopping frequency Fc. This voltage feedback signal is coupled to the sense winding 32 by the mutual inductance of the current transformer 30. This AC feedback signal provided to the sense winding 32 is fed through the switches of chopper 42 which rectify the signal to become a DC voltage of opposite polarity to the DC offset voltage of amplifier 41 and which, when applied to the amplifier, compensates for the effects of the offset voltage.

FIG. 3 shows the relationships of the applied primary current 71 (Ip) and the resultant output current 73 (Io1) and the chopper signal 47 (Fc). Referring to FIG. 3, the upper curve illustrates the sinusoidal 60 Hertz current flow Ip in amperes in the power line being metered. The chopping frequency Fc is a square wave signal at a frequency of 154.25 Hertz. The Io1 output signal is a scaled down signal in milliamps representing the current Ip wherein portions of the signal such as 56 and 57 are of reversed polarity due to the switching action of chopper 42. However, the inverted portions of the Io1 current 56 and 57 are subsequently corrected for inversion to accurately represent the sine wave current Ip.

Referring to FIG. 2, the amplifier 41 responding to current Ip in the primary 31 drives a current in the feedback winding 33 in a direction to null the voltage on the sense winding 32. This "null flux" condition is ideally met when the ampere-turns of the feedback winding 33 exactly counteract the ampere-turns through the primary 31 of the current transformer 30. The null flux condition can be illustrated, by way of example, when 2.0 milliamps flow through the 1500 turn feedback winding 33 to balance 3.0 ampere turns applied by primary winding 31 of the current transformer 30. That is 2 milliamps times 1500 turns is 3000 milliamp turns which equals the 3 amperes times 1 turn or 3 ampere turns.

The output current Io1 is thus made to represent a scaled down replica value of the current Ip. As discussed above in connection with FIG. 1, the scaled current signal Io1 73, is provided to multiplexer 4; along with Io2, the output of the line 2 current scaling and isolation circuit 2; and also Io3, the output of the line 3 current scaling and isolation circuit 3. Multiplexer 4 sequentially combines the three scaled current signals into a multiplexed current signal which is converted to a voltage signal Vo by the current-to-voltage converter 5. Current to voltage converter 5 includes an operational amplifier 52 including a precision feedback resistor 53 which may be an adjustable resistor as shown. Current flow through the resistance of converter 5 provides the output voltage signal Vo.

Thus, an effective yet simple chopper stabilized electronic power meter is provided by the present invention. The Fc chopping signal 47 is unmodulated and simple to provide by a square wave generator 46. Since it does not represent and is not tied to any other sampled signal, as in U.S. Pat. No. 4,761,605, where the signal is modulated, it can be, and is, at a desirable lower frequency, namely 154.25 Hertz, thus keeping the frequencies of Io1, Io2, and Io3 lower. This lower frequency in turn reduces the gain-bandwidth product required of the A1 amplifier 41 and the amplifier 52, and their corresponding amplifiers in the current scaling and isolation circuits 2 and 3. As a result these four amplifiers may be less sophisticated, making them easier and lower cost to produce.

In addition, and also important as pointed out above, the ability to select the chopper signal 47 independently of any modulating frequency makes it possible to ensure that harmonics of the chopper signal are substantially different from of the power line frequency (e.g., 50 or 60 Hertz) and its harmonics over the frequency range of interest in power metering. The electronic signal processing circuits such as the analog to digital converter 7, multiplier 21, and/or display and record circuitry 24 can easily include a filter to filter out any noise introduced by Fc.

In addition, it is possible, to realize yet additional benefits in using the current analog to digital converter 7. The benefits include the removal of the signal inversion introduced by the chopping frequency 47 through the simple logical operation known as two's complement logic circuit or function (not shown). Furthermore, the timing of the digital sampling signals provided by timing signals circuit 11 can be synchronized with the transitions of Fc to avoid sampling at the transition time of Vo, or Io1, thus further reducing the performance requirements and sophistication of amplifiers 41 and 52, and at the same time producing a sampled current waveform for feeding multiplier 21 which is free of transients introduced by the chopper 42 at the transitions of Fc.

It is thus apparent that a number of important benefits for electronic power meters flow from the improvements of the present invention. Accordingly, while the present invention has been described with respect to certain preferred embodiments thereof, it is to be understood that numerous variations in the details of construction, the arrangement and combination of parts, and the type of materials used may be made without departing from the spirit and scope of the invention.

What is claimed is:

1. In an electronic digital polyphase power meter wherein analog signals proportional to current flow in, and voltage across phase conductors of power lines being metered are converted to digital signals in current and voltage analog to digital converters, respectively, before being multiplied in a digital multiplier circuit to provide a signal proportional to power in said power lines, stabilization means comprising:

a current transformer for each phase, each for connection in an associated one of the phase conductors of said power lines to develop an ouput current signal proportional to current flowing in its associated phase conductor, each of said current transformers including a primary winding, a sense winding and a feedback winding;

a switching means for each of said current transformers, each for connection to the sense winding and the feedback winding of an associated one of said current transformers;

at least one square wave generator for providing an unmodulated square wave signal to said switching means for controlling the switching thereof, the frequency of said square wave signal being low and of a prescribed frequency such that its harmonics are not equal to the harmonics of the frequency of the current which flows in the phase conductors of said power lines over a wide range of harmonics;

an amplifier associated with each of said switching means and each of said current transformers, each amplifier having an output and an inherent DC offset at an input thereof, each amplifier having its input and output connected, through its associated switching means, to the sense winding and the feedback winding, respectively, of its associated current transformer to provide a feedback signal from the output of the amplifier to the feedback winding to compensate for DC offset at the input of the amplifier and to provide a scaled down isolated output current signal from the feedback winding which varies in accordance with the current flow in the phase conductor being metered; and a multiplexer, responsive to the output current signal from the feedback winding of each of the current transformers, for providing a multiplexed signal including samples of the output current signals to said current analog to digital converter; whereby filtering of of haromonics is rendered unnecessary.

2. An electronic digital polyphse power meter in accordance with claim 1 wherein the frequency of said square wave signal is in the range of more than the first harmonic but less than the fourth harmonic of the power lines frequency whereby the gain bandwidth requirements for each of the amplifiers is minimized.

3. In an electronic digital polyphase power meter wherein analog signals proportional to current flow in, and voltage across phase conductors of power lines being metered are converted to digital signals in current and voltage analog to digital converters, respectively, before being multiplied in a digital multiplier circuit to provide a signal proportional to power in said power lines, stabilization means comprising:

a current transformer for each phase, each for connection in an associated one of the phase conductors of said power lines to develop an output current signal proportional to current flowing in its associated phase conductor, each of said current transformers including a primary winding, a sense winding and a feedback winding;

a switching means for each of said current transformers, each for connection to the sense winding and the feedback winding of an associated one of said current transformers;

at least one square wave generator for providing an unmodulated square wave signal to said switching means for controlling the switching thereof, the frequency of said square wave signal being low such that its harmonics are not equal to the harmonics of the frequency of the current which flows in the phase conductors of said power lines over a wide range of harmonics;

an amplifier associated with each of said switching means and each of said current transformers, each amplifier having an output and an inherent DC offset at an input thereof, each amplifier having its input and output connected, through its associated switching means, to the sense winding and the feedback winding, respectively, of its associated current transformer to provide a feedback signal from the output of the amplifier to the feedback winding to compensate for DC offset at the input of the amplifier and to provide a scaled down isolated output current signal from the feedback winding which varies in accordance with the current flow in the phase conductor being metered;

a multiplexer, responsive to the output current signal from the feedback winding of each of the current transformers, for providing a multiplexed signal including samples of the output current signals to said current analog to digital converter;

the frequency of said square wave signal is in the range of more than the first harmonic but less than the fourth harmonic of the power lines frequency whereby the gain bandwidth requirements for each of the amplifiers is minimized; and the frequency of said square wave signal is in the range of more than 60 Hertz but less than 180 Hertz;

whereby filtering of harmonics is rendered unnecessary.

4. An electronic digital polyphase power meter in accordance with claim 3 wherein the frequency of said square wave signal is approximately 154.25 Hertz for 60 Hertz power lines.

5. An electronic digital power meter in accordance with claim 3 wherein the frequency of said square wave signal is approximately 128.5 Hertz for 50 Hertz power lines.

6. In an electronic digital polyphase power meter wherein analog signals proportional to current flow in, and voltage across phase conductors of power lines being metered are converted to digital signals in current and voltage analog to digital converters, respectively, before being multiplied in a digital multiplier circuit to provide a signal proportional to power in said power lines, stabilization means comprising:

a current transformer for each phase, each for connection in an associated one of the phase conductors of said power lines to develop an output current signal proportional to current flowing in its associated phase conductor, each of said current transformers including a primary winding, a sense winding and a feedback winding;

a switching means for each of said current transformers, each for connection to the sense winding and the feedback winding of an associated one of said current transformers;

at least one square wave generator for providing an unmodulated square wave signal to said switching means for controlling the switching thereof, the frequency of said square wave signal being low such that its harmonics are not equal to the harmonics of the frequency of the current which flows in the phase conductors of said power lines over a wide range of harmonics;

an amplifier associated with each of said switching means and each of said current transformers, each amplifier having an output and an inherent DC offset at an input thereof, each amplifier having its input and output connected, through its associated switching means, to the sense winding and the feedback winding, respectively, of its associated current transformer to provide a feedback signal from the output of the amplifier to the feedback winding to compensate for DC offset at the input of the amplifier and to provide a scaled down isolated output current signal from the feedback winding which varies in accordance with the current flow in the phase conductor being metered;

a multiplexer, responsive to the output current signal from the feedback winding of each of the current transformers, for providing a multiplexed signal including samples of the output current signals to said current analog to digital converter;

the frequency of said square wave signal is in the range of more than the first harmonic but less than the fourth harmonic of the power lines frequency whereby the gain bandwidth requirements for each of the amplifiers is minimized;

the frequency of said square wave signal is in the range of more than 60 Hertz but less than 180 Hertz;

the frequency of said square wave signal is in the range of more than 60 Hertz but less than 180 Hertz;

the frequency of said square wave signal is approximately 154.25 Hertz for 60 Hertz power lines;

the frequency of said square wave signal is approximately 128.5 Hertz for 50 Hertz power lines; and sampling signals are provided to said current analog to digital converter, the timing of which are controlled to avoid sampling at the transitions of said square wave signal to prevent transients in the multiplexed signal from affecting the conversion accuracy of said current analog to digital converter.

7. An electronic digital polyphase power meter in accordance with claim 6 wherein signal inversions in the output current signal, introduced by said switching means, are removed by a two's complement logic operation prior to application of the digital signals from said current analog to digital converter to said multiplier circuit.

8. In an electronic digital polyphase power meter in accordance with claim 7 wherein a filter is provided for filtering the frequency of said square wave signal out of said multiplexed signal.

9. In an electronic digital power meter wherein analog signals proportional to current flow in, and voltage across, the power lines being metered are converted to digital signals in current and voltage analog to digital converters, respectively, before being multiplied in a digital multiplier circuit to provide a signal proportional to power in said power lines, stabilization means comprising:
- a current transformer for connection in the power lines to develop a current output signal proportional to current flowing in the power lines, said current transformer including, a primary winding, a single winding and a feedback winding;
- switching means connected to said sense winding and said feedback winding;
- a square wave generator for providing an unmodulated square wave signal to said switching means for controlling the switching thereof, the frequency of said square wave signal being low and of a prescribed frequency such that its harmonics are not equal to the harmonics of the frequency of the current which flows in the power lines over a wide range of harmonics; and
- an amplifier having an output and an inherent DC offset at an input thereof, said amplifier having its input and output connected, through said switching means, to the sense winding and the feedback winding, respectively, of said current transformer to provide a feedback signal from the output of said amplifier to the feedback winding to compensate for DC offset at the input of said amplifier and to provide, to said current analog to digital converter, a scaled down isolated output current signal from the feedback winding which varies in accordance with the current flow in said power lines, whereby filtering of harmonics is rendered unnecessary.

10. An electronic digital power meter in accordance with claim 9 wherein the frequency of said square wave signal is in the range of more than the first harmonic but less than the fourth harmonic of the power lines frequency.

11. In an electronic digital power meter wherein analog signals proportional to current flow in, and voltage across, the power lines being metered are converted to digital signals in current and voltage analog to digital converters, respectively, before being multiplied in a digital multiplier circuit to provide a signal proportional to power in said power lines, stabilization means comprising:
- a current transformer for connection in the power lines to develop a current output signal proportional to current flowing in the power lines, said current transformer including, a primary winding, a sense winding and a feedback winding;
- switching means connected to said sense winding and said feedback winding;
- a square wave generator for providing an unmodulated square wave signal to said switching means for controlling the switching thereof, the frequency of said square wave signal being low such that its harmonics are not equal to the harmonics of the frequency of the current which flows in the power lines over a wide range of harmonics;
- an amplifier having an output and an inherent DC offset at an input thereof, said amplifier having its input and output connected, through said switching means, to the sense winding and the feedback winding, respectively, of said current transformer to provide a feedback signal from the output of said amplifier to the feedback winding to compensate for DC offset at the input of said amplifier and to provide, to said current analog to digital converter, a scaled down isolated output current signal from the feedback winding which varies in accordance with the current flow in said power lines;
- the frequency of said square wave signal is in the range of more than the first harmonic but less than the fourth harmonic of the power lines frequency; and
- the frequency of said square wave signal is in the range of more than 60 Hertz but less than 180 Hertz;
- whereby filtering of harmonics is rendered unnecessary, while providing DC chopper stabilization.

12. An electronic digital power meter in accordance with claim 11 wherein the frequency of said square wave signal is approximately 154.25 Hertz for 60 Hertz power lines.

13. An electronic digital power meter in accordance with claim 12 wherein the frequency of said square wave is approximately 128.5 Hertz for 50 Hertz power lines.

14. An electronic digital power meter in accordance with claim 13 wherein said current analog to digital converter converts said current output signal to a digital signal proportional to current flowing in said power lines.

15. In an electronic digital power meter wherein analog signals proportional to current flow in, and voltage across, the power lines being metered are converted to digital signals in current and voltage analog to digital converters, respectively, before being multiplied in a digital multiplier circuit to provide a signal proportional to power in said power lines, stabilization means comprising:
- a current transformer for connection in the power lines to develop a current output signal proportional to current flowing in the power lines, said current transformer including, a primary winding, a sense winding and a feedback winding;
- switching means connected to said sense winding and said feedback winding;
- a square wave generator for providing an unmodulated square wave signal to said switching means for controlling the switching thereof, the frequency of said square wave signal being low such that its harmonics are not equal to the harmonics of the frequency of the current which flows in the power lines over a wide range of harmonics;
- an amplifier having an output and an inherent DC offset at an input thereof, said amplifier having its input and output connected, through said switching means, to the sense winding and the feedback winding, respectively, of said current transformer to provide a feedback signal from the output of said amplifier to the feedback winding to compensate for DC offset at the input of said amplifier and to provide, to said current analog to digital converter, a scaled down isolated output current signal from the feedback winding which varies in accordance with the current flow in said power lines;
- the frequency of said square wave signal is in the range of more than the first harmonic but less than the fourth harmonic of the power lines frequency;

the frequency of said square wave signal is in the range of more than 60 Hertz but less than 180 Hertz;

the frequency of said square wave signal is in the range of more than 60 Hertz but less than 180 Hertz;

the frequency of said square wave signal is approximately 154.25 Hertz for 60 Hertz power lines;

said current analog to digital converter converts said current output signal to a digital signal proportional to current flowing in said power lines; and sampling signals are provided for said current analog to digital converter, the timing of which are controlled to avoid sampling at the transitions of said square wave signal to prevent transients in the multiplexed signal from affecting the conversion accuracy of said current analog to digital converter.

16. An electronic digital power meter in accordance with claim 15 wherein the signal inversions in the output current signal, introduced by said switching means, are removed by a two's complement logic operation prior to application of the digital signals from said current analog to digital converter to said multiplier circuit.

17. An electronic digital power meter in accordance with claim 16 wherein a filter is provided for filtering the frequency of said square wave signal out of said output current signal.

18. A stabilization system for use in an electronic digital power meter of the type wherein analog signals proportional to current flow in power lines is metered for subsequent conversion to digital signals proportional to current in the power lines, comprising:

a current transformer including, a primary winding for sensing current flowing in the power lines, a feedback winding for providing an output current signal proportional to current flowing in said primary winding and a sense winding;

an amplifier having an output and an input, said amplifier having an inherent DC offset at its input;

a generator for generating an unmodulated output signal of a prescribed frequency of which the harmonics thereof are not equal to the harmonics of the frequency of the current flowing in the power lines over a wide range of harmonics; and chopper means including, first switch means connecting the sense winding of said current transformer to the input of said amplifier, second switch means connecting the output of said amplifier to the feedback winding of said transformer, said chopper means responsive to said unmodulated output signal from said generator and actuating said first and second switch means whereby, a feedback signal from the output of said amplifier is provided to the feedback winding and a compensation signal is provided from the sense winding to said amplifier to compensate for the DC offset at the input thereof to thereby control the output current signal from the feedback winding of said transformer as an accurate representation of the current flowing in the primary winding of said transformer; whereby filtering of harmonics is rendered unnecessary.

19. A stabilization system for use in an electronic digital power meter of the type wherein analog signals proportional to current flow in power lines is metered for subsequent conversion to digital signals proportional to current in the power lines, comprising:

a current transformer including, a primary winding for sensing current flowing in the power lines, a feedback winding for providing an output current signal proportional to current flowing in said primary winding and a sense winding;

an amplifier having an output and an input, said amplifier having an inherent DC offset at its input;

a generator for generating an unmodulated output signal of a prescribed frequency of which the harmonics thereof are not equal to the harmonics of the frequency of the current flowing in the power lines over a wide range of harmonics;

chopper means including, first switch means connecting the sense winding of said current transformer to the input of said amplifier, second switch means connecting the output of said amplifier to the feedback winding of said transformer, said chopper means responsive to said unmodulated output signal from said generator and actuating said first and second switch means whereby, a feedback signal from the output of said amplifier is provided to the feedback winding and a compensation signal is provided from the sense winding to said amplifier to compensate for the DC offset at the input thereof to thereby control the output current signal from the feedback winding of said transformer as an accurate representation of the current flowing in the primary winding of said transformer; and said chopper means further includes third switch means connected to the feedback winding of said current transformer and responsive to said unmodulated output signal from said generator for chopping the output current signal from the sense winding.

20. The stabilization system in accordance with claim 19 wherein the chopped output current signal from said third switch means is converted to a voltage signal proportional to current flow in the primary winding of said current transformer prior to being converted to digital signals.

21. The stabilization system in accordance with claim 20 wherein said unmodulated output signal from said generator is a square wave.

* * * * *